United States Patent [19]
Sato et al.
[11] Patent Number: 4,764,728
[45] Date of Patent: Aug. 16, 1988

[54] APPARATUS FOR DETECTING POSITION OF FAULTY LIGHT EMITTING ELEMENT IN LARGE SCREEN DISPLAY SYSTEM

[75] Inventors: Yasuhiro Sato; Katsuya Tsuji, both of Nagasaki, Japan

[73] Assignee: Mitsubishi Denki Kabushiki Kaisha, Tokyo, Japan

[21] Appl. No.: 901,418

[22] Filed: Aug. 28, 1986

[30] Foreign Application Priority Data

Aug. 29, 1985 [JP] Japan ............ 60-190421
Aug. 29, 1985 [JP] Japan ............ 60-190422

[51] Int. Cl.[4] ............ G01R 31/26
[52] U.S. Cl. ............ 324/512; 324/537; 324/155 D
[58] Field of Search ............ 324/158 D, 500, 512, 324/537, 555; 340/762, 782, 514, 640, 641, 825.82

[56] References Cited

U.S. PATENT DOCUMENTS 3,686,661 8/1972 Sharpless ............ 340/762 X
4,357,671 11/1982 Miller ............ 340/782 X
4,365,244 12/1982 Gillessen et al. ............ 340/782

FOREIGN PATENT DOCUMENTS 55-749 1/1980 Japan .

OTHER PUBLICATIONS

Hobbis et al., "Light Operated Read-Only Store", IBM Technical Disclosure Bulletin vol. 8 No. 4 Sep. 1965.

*Primary Examiner*—Reinhard J. Eisenzopf
*Assistant Examiner*—Robert W. Mueller
*Attorney, Agent, or Firm*—Bernard, Rothwell & Brown

[57] ABSTRACT

An apparatus designed for detecting the position of a faulty light emitting element and installed in a large screen display system which is equipped with a large screen consisting of multiple light emitting elements such as cathode-ray tubes or electric bulbs arrayed vertically and horizontally in columns and rows to display desired still images, characters or motion images, and also with a character processor and motion image processor as control means. The apparatus comprises an input means for receiving a drive command to turn on or off an arbitrary group of light emitting elements out of those constituting the large screen; a display means for displaying the content of the command fed to the input means; a character processor for converting the content of the command into a signal and outputtting the signal to a motion image processor; and the motion image processor for writing the output signal of the character processor in and reading it out from an incorporated memory, thereby continuously processing the position data designated by the input means relative to the element group to be turned on or off. Detecting the position of any faulty light emitting element can be achieved by adjusting the faulty element to attain positional conincidence with the element group to be turned on or off.

13 Claims, 10 Drawing Sheets

FIG. 8(a)
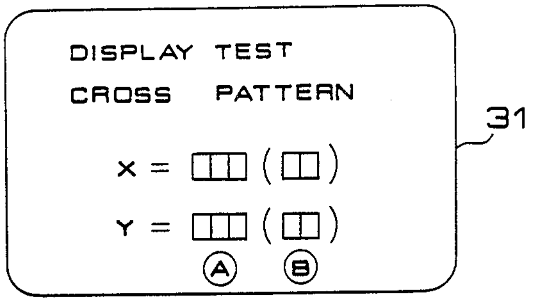
FIG. 8(b)
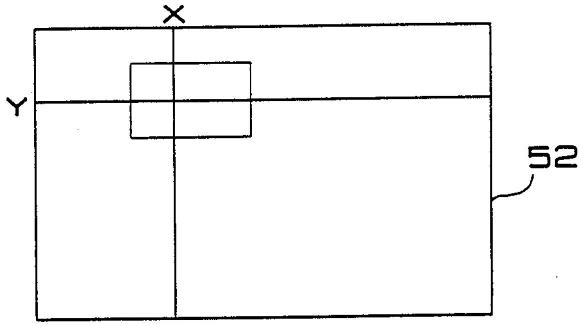
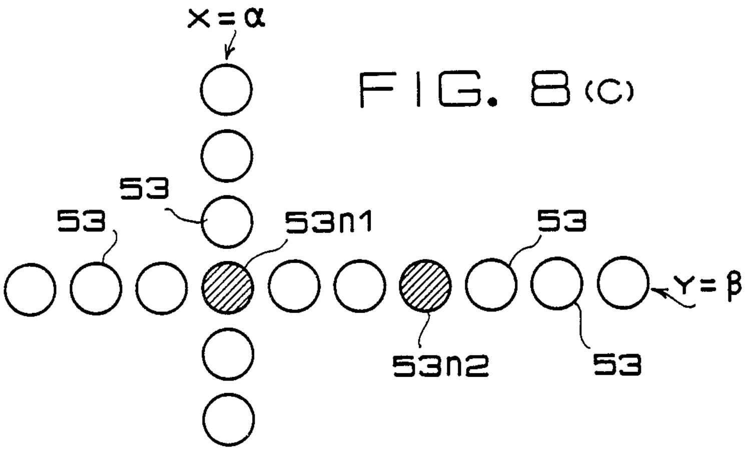
FIG. 8(c)

APPARATUS FOR DETECTING POSITION OF FAULTY LIGHT EMITTING ELEMENT IN LARGE SCREEN DISPLAY SYSTEM

BACKGROUND OF THE INVENTION

1. Field of the Invention

The present invention relates to an apparatus for detecting the position of any faulty light emitting element upon occurrence of failure in one or more of multiple display elements arrayed on the screen of a large-sized display system.

2. Description of the Prior Art

In the recent sports stadiums or the like such as baseball stadiums, soccer stadiums and so forth where multiple spectators gather, there is practically used a large screen display system—e.g. known by the trade name of Aurora Vision or Diamond Vision—which is equipped with a multiplicity of light emitting sources arrayed in columns and rows to constitute a large-sized screen and displays still images, motion images, characters and so forth on such screen for giving specific information to the spectators.

The above large screen display system principally comprises a display means including a large-sized screen, a power supply panel and a display controller; and an operating means including a computer, a character editing terminal, a screen control terminal and a special effect switcher. The large-sized screen is composed of a multiplicity of light emitting elements such as incandescent lamps or light source tubes of recently developed high-luminance CRTs which are arrayed in columns and rows vertically and horizontally to constitute a combination of many units in accordance with the screen size, wherein each unit is composed of a predetermined number of such elements as, for example, $4\times8=32$.

When there occur faults of multiple light emitting elements in the display means constituting the large screen, the information such as images or characters displayed on the screen fail to be transmitted properly to the spectators, so that fast replacement or repair of the faulty elements is necessary. And to perform such repair, it is requisite to first detect which of the multiple light emitting elements are faulty.

In the prior art, there is known one exemplary apparatus of FIGS. 1 and 2 for positional detection of faulty light emitting elements, wherein a large screen 2 of a large-sized display system 1 is composed of a multiplicity of display units 3 . . . and is connected to an unshown display controller. Each of the display units 3 consists of, for example, an array of 32 light emitting elements 4 (eight in a row and four in a column) such as incandescent lamps or high-luminance CRTs (cathode-ray tubes), and the elements 4 are assorted in three primary colors as red (R), blue (B) and green (G). In an arbitrary display unit 3*n* out of the entire units 3 in FIG. 1, the light emitting elements 4 are arrayed as illustrated.

For detection of any fault such as breaking or luminance reduction in the individual light emitting elements 4 . . . of the display unit 3*n*, a faulty-element position detecting apparatus 10 is employed. The detecting apparatus 10 principally comprises a power supply 11 fed with external detecting power via a power cable 12, and a detector 21 disposed above the power supply 11 and serving to detect the position of each faulty light emitting element. An operating panel 13 is disposed on the front of the power supply 11 and is equipped with a voltmeter 14, an ammeter 15, a selector switch 16 for selecting a desired lighting display mode such as lighting of all elements of a unit or lighting of half elements of a unit or lighting of each element of a unit and a lighting switch 17 for simultaneously turning on the entire light emitting elements in the display unit 3. Three cables extending from the detector 21 have, at the fore ends thereof, plugs connectable to connectors (not shown) of the display unit 3. The cables consist of an output data cable 22, a set/reset signal cable 23 and a DC power/AC power cable 24 for respectively supplying an output data signal, a set/reset signal and a DC power/AC power from the detector 21 to the display unit 3. Light acceptant parts 25 . . . for insertion of luminous parts pointed ends of the light emitting elements 4 . . . on the back of the display unit 3 are arrayed on the front of the detector 21 correspondingly to the light emitting elements 4 . . . , and unit testing positioners 18 and 19 are disposed in front of the light acceptant parts 25 above the power supply 11. A luminance adjusting dial assembly 26 is disposed above the light acceptant parts 25 . . . of the detector 21 so that, for example, the luminance of red light emitting elements R can be adjusted by a dial 26*a*, the luminance of blue light emitting elements B by a dial 26*b*, and the luminance of green light emitting elements G by a dial 26*c*, respectively. On the panel where the luminance adjusting dial assembly 26 is located, pairs of light emitting diodes (LEDS) 27 and 28 are provided for the individual light emitting elements of the display unit 3. For example, each pair of such LEDs consists of a diode 27 turned on at the luminance of a predetermined low level and a diode 28 turned on at the luminance of a predetermined high level.

In the faulty-element position detecting apparatus 10 having the above-described structure, the following operation is performed.

First, as shown in FIG. 1, an arbitrary display unit 3*n* in the large screen 2 of the large display system 1 is removed from the screen 2. Then the display unit 3*n* is slid as shown in FIG. 2 along the unit testing positioners 18 and 19 located above the power supply 11 of the position detecting apparatus 10, and luminous parts as pointed ends of the light emitting elements 4 are inserted into the light acceptant parts 25 . . . of the detector 21 in the position detecting apparatus 10. And simultaneously the lighting test cables 22–24 are connected to unshown connectors of the display unit 3*n*.

In a test for detecting any fault such as breaking of the light emitting elements 4 . . . , the lighting switch 17 is turned on to supply power to the display unit 3*n* through the cables 22–24, and the operator visually checks whether the entire light emitting elements 4 . . . (e.g. 32 elements in the example illustrated) arrayed in the display unit 3*n* are turned on. In case one of the light emitting elements 4 . . . fails to be turned on, the faulty element 4*n* is replaced.

Subsequently, when detecting whether luminance reduction is present or not in any of the light emitting elements 4 . . . , scale "ALL" is selected by the selector switch 16 after placing the display unit 3*n* at a prescribed position. Since the entire light emitting elements 4 . . . of the display unit 3*n* are turned on, it is possible by adjustment of the individual dials 26 to check whether a predetermined luminance as a whole is retained or not from turn-on of the LEDs 27 and 28.

Relative to the conventional faulty-element position detecting apparatus of the aforementioned structure that performs the above operation, an exemplary circuit configuration is disclosed in Patent Publication No. 55 (1980)-749 issued from the Japanese Patent Office. However, "Electric Display Board Monitoring Apparatus" according to the above invention is not equipped with a circuit to conduct a luminance reduction test. In the aforementioned procedure, the operator detects a faulty light emitting element 4*n* visually with his naked eyes by sequentially turning on the light emitting elements 4. Meanwhile the apparatus disclosed in the above patent publication is equipped with "a circuit for scanning and detecting the presence or absence of a breaking signal", so that it is capable of automatically counting the number of faulty light emitting elements by means of a counter and displaying the positions thereof in a continuous lighting test mode selected by setting at scale "SEQ".

However, there still exist the following problems in such conventional detecting apparatus.

Firstly, in conducting the above test by sequentially removing the entire display units 3 . . . incorporated in the large screen 2 of the large display system 1 and setting each display unit in the detecting apparatus 10, an excessive burden is imposed on the operator and, with dimensional increase of the large display system 1, positional detection of faulty light emitting elements is operationally complicated to consequently bring about a failure in achieving complete and precise maintenance of the large display system 1.

Secondly, in case no scanning detection circuit is provided, the detection is dependent mostly on the visual inspection by the operator, and therefore exact positional detection of a faulty light emitting element is not attainable. And even with the provision of a scanning detection circuit, visual inspection is still requisite in the process of finding, out of the large screen 2, the display unit 3*n* where the faulty light emitting element is existent, hence rendering accurate detection of the faulty portion impossible.

Thirdly, in the conventional position detecting apparatus where the scale "ALL", "HALF" or "SEQ" is selected by the test-mode setting switch 16 to conduct a test in each selected mode as well as a lighting test and a luminance reduction test, it is impossible to individually detect a breaking fault or luminance reduction with respect to any specific light emitting element 4, and regardless of such inevitable removal of each display unit 3 from the large screen 2 for testing, the detecting operation is rather rough and exact control is not achievable for the system, hence lacking in reliability for detection of any faulty light emitting element.

And fourthly, for enabling continuous use of the large display system 1, it is necessary to install a large-sized position detecting apparatus 10 which is dimensionally a multiple of the display unit 3 and, as the number or size of display units 3 . . . becomes greater with further dimensional extension of the display system 1, there arise some problems to be taken into consideration, such as increased economical burden on purchasers, need of a sufficient space for installation of the position detecting apparatus and so forth.

SUMMARY OF THE INVENTION

In the apparatus of the present invention for detecting the position of a faulty light emitting element in a large screen display system, it is a first object to enable an operator to perform the positional detection of any faulty light emitting element without the necessity of removing any display unit from a large screen, thereby alleviating the working burden on the operator.

A second object of the invention resides in mechanizing, by a combination of a CRT display and a keyboard, the detection of a faulty display unit in the large screen and also the detection of a faulty light emitting element in the display unit that have been executed heretofore merely by visual inspection of the operator, thereby achieving accurate positional detection of any faulty light emitting element.

A third object of the invention is to realize facilitated detection of the exact position of any faulty light emitting element in a specific display unit by the above combination of a CRT display and a keyboard, hence enhancing the reliability in the detecting operation.

And finally a fourth object of the invention is to reduce the overall production cost as well as to minimize the required space for installation by incorporating a faulty-element position detecting apparatus in the large screen display system.

For attaining the objects mentioned, in the apparatus of this invention designed for detecting the position of a faulty light emitting element in a large screen display system which is equipped with at least a character processor and a motion image processor as display control means, there are included a CRT display device for displaying the positions of light emitting elements being driven out of a multiplicity of elements arrayed in columns and rows, and an input device connected to both the CRT display device and the character processor and serving to turn on or off a group of light emitting elements in a desired area by inputting a drive command signal to the motion image processor via the character processor.

BRIEF DESCRIPTION OF THE DRAWINGS

FIGS. 8A, 8B, and 8C are front views respectively showing a CRT screen, a large display screen, and enlarged portions of light emitting elements crossed in a column and a row.

DETAILED DESCRIPTION OF THE PREFERRED EMBODIMENTS

Figure 1:
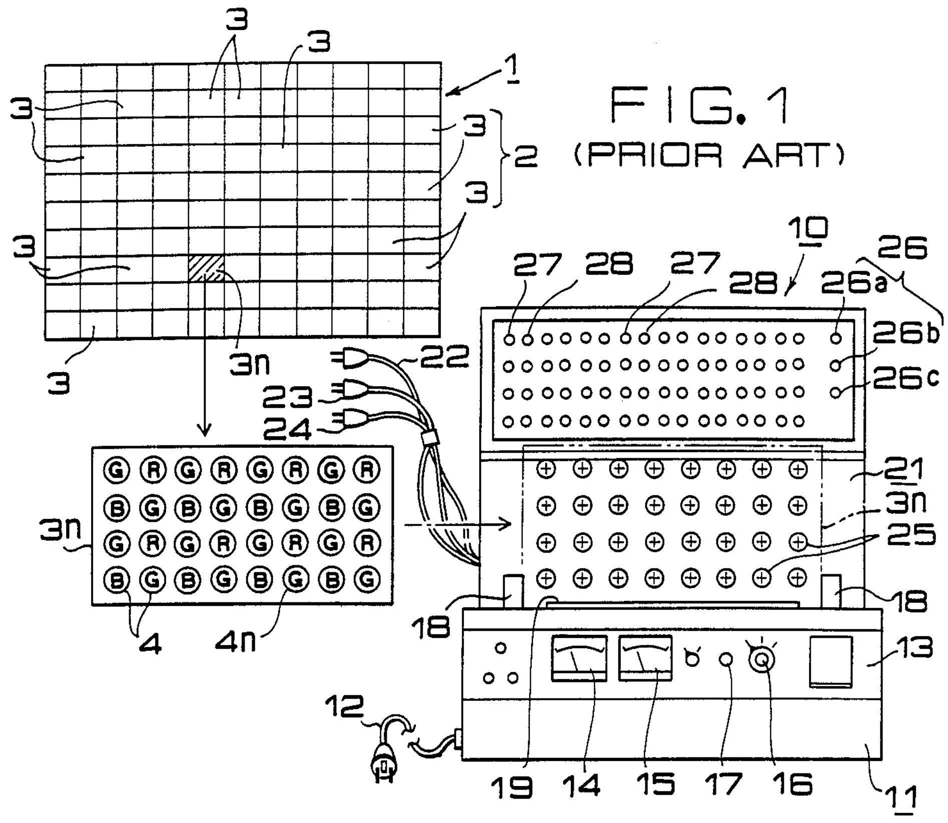
FIG. 1 (PRIOR ART)
FIG. 1 is a front view of a conventional apparatus for detecting the position of a faulty light emitting element in a large display system.
Figure 2:
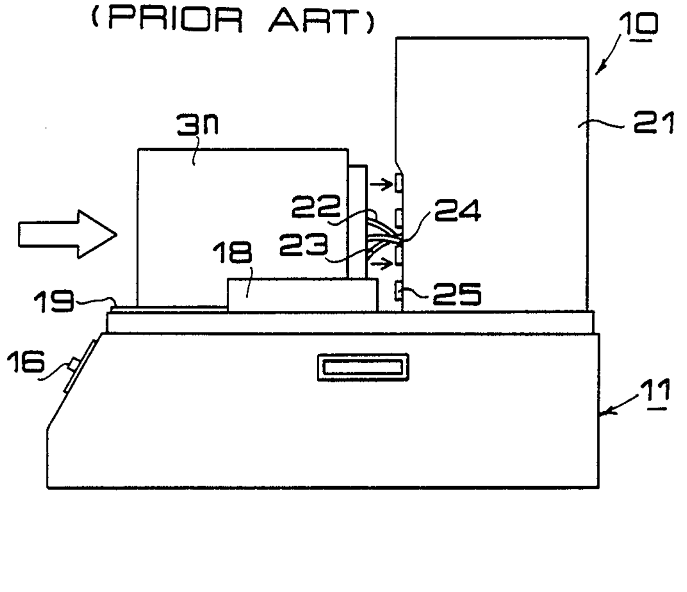
FIG. 2 (PRIOR ART)
FIG. 2 is a right side view of the apparatus shown in FIG. 1.
Figure 3:
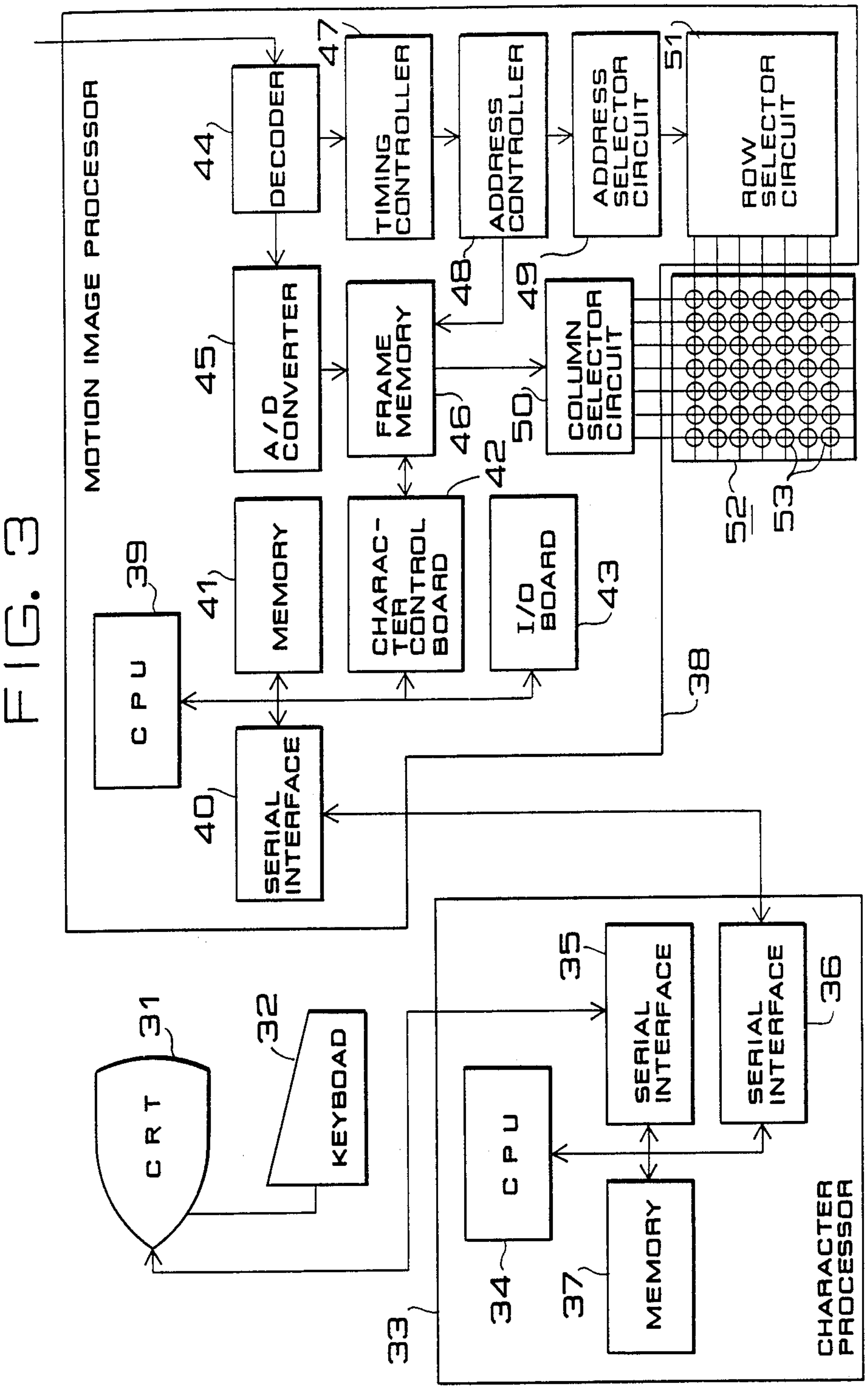
FIG. 3 is a block diagram of an apparatus of the present invention for detecting the position of a faulty light emitting element in a large screen display system.

Hereinafter an exemplary embodiment of the present invention will be described with reference to the accompanying drawings. In FIG. 3, there are shown a CRT display 31 having a character display function; a keyboard 32; a character processor 33 for executing video display, digital display or special effect display; a CPU board 34; a serial interface 35 for transferring data to and from the CRT display 31; a serial interface 36 for transferring data to and from an undermentioned motion image processor 38; a memory board 37; the motion image processor 38 for executing video display by processing a video signal, or executing digital display or special effect display in response to a digital signal received from the character processor 33; a CPU board 39; a serial interface 40 for transferring data to and from the character processor 33; a memory board 41; a character control board 42 for processing the character display; an input/output board 43; a decoder 44 for decomposing the received video signal into three color components of red, green and blue and generating a synchronizing signal; an A/D converter 45 for converting three video (analog) signals of red, green and blue into digital signals; a frame memory 46 including a video memory, video mask memory or character memory in conformity with each purpose and serving to store the video data converted into a digital form or the character data or mask data transferred from the character control board 42; a timing controller 47 for generating video data write addresses and A/D conversion sampling pulses; an address controller 48 for generating video data read addresses and character data write/read addresses; an address selector circuit 49 for generating addresses and set/reset pulses used to set or reset the signal for turning on or off undermentioned light emitting elements 53; a column selector circuit 50 for selectively latching 16 dots of the data read out from the frame memory 46 and transferring the latched data to the display board 52; a row selector circuit 51 receiving the set/reset pulses and the addresses and sending 8 bits of the set/reset signal at a time to the display board; a display board 52; and light emitting elements 53.

Figure 4A:
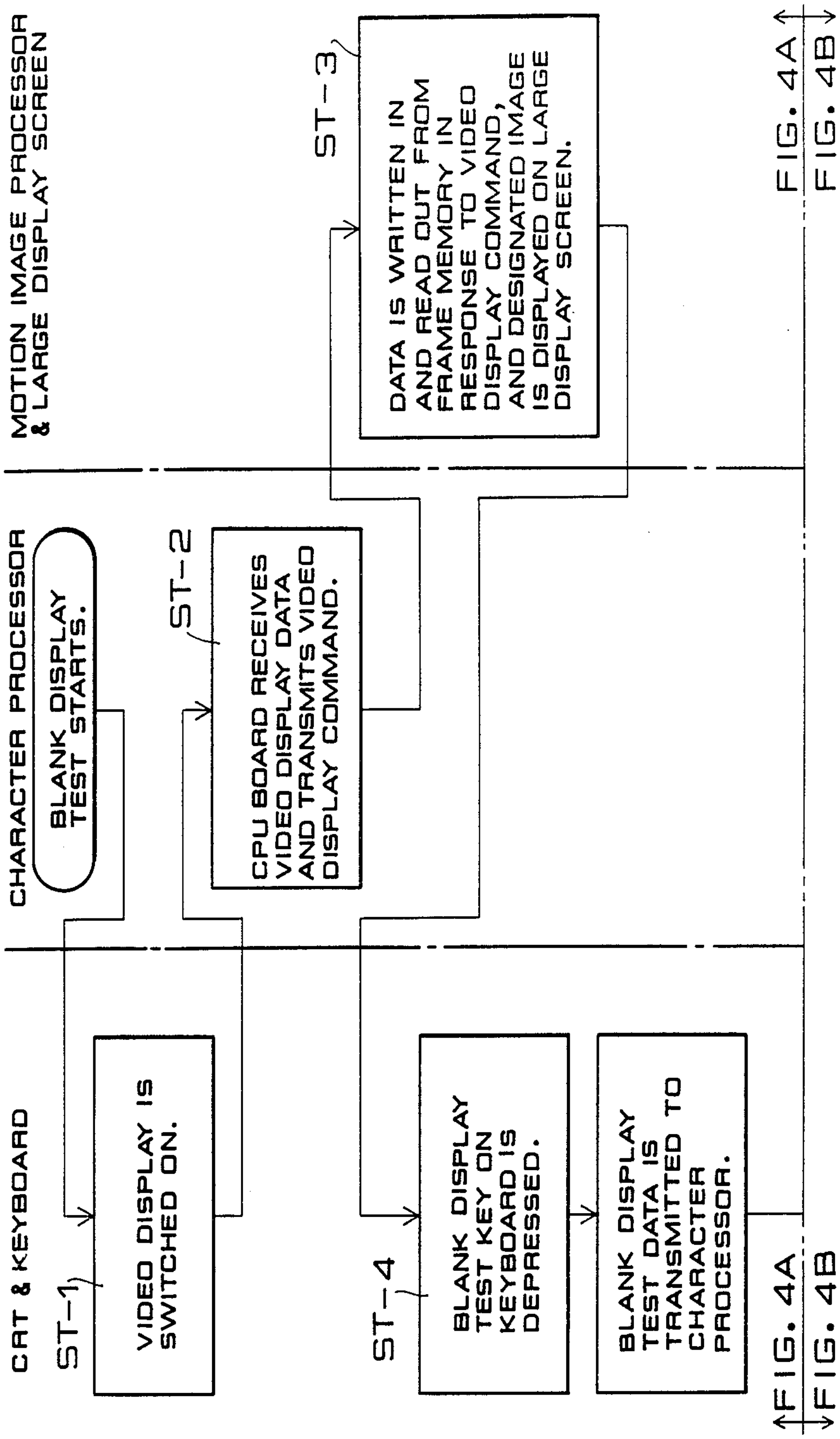
FIG. 4A and FIG. 4B form a flow chart schematically showing the steps of a blank display test conducted in an exemplary position detecting apparatus of the invention.
Figure 4B:
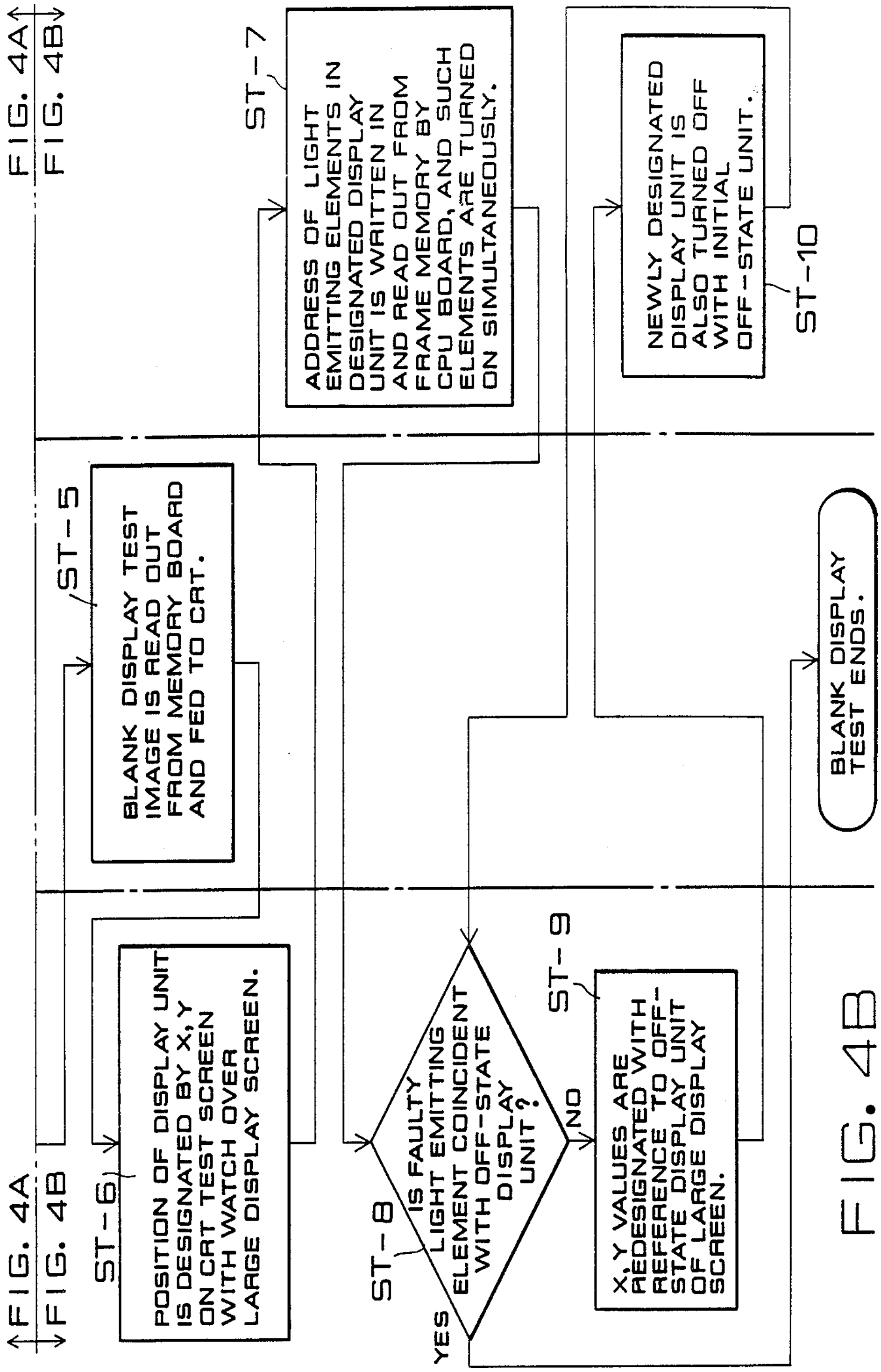
Figure 5A:
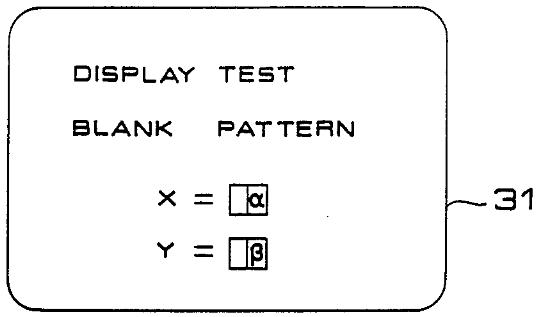
FIGS. 5A, 5B, and 5C are front views respectively showing a CRT screen, a large display screen and enlarged light emitting elements of one display unit in the test of FIGS. 4A and 4B.
Figure 5B:
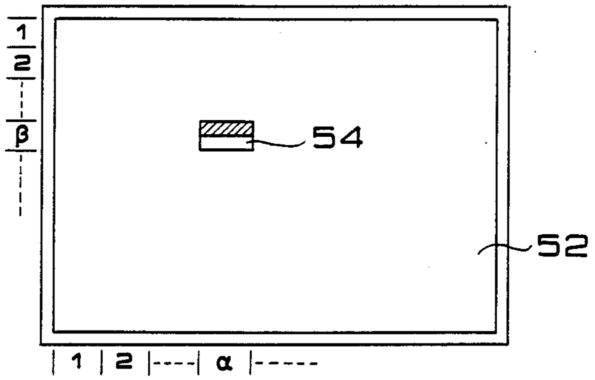
Figure 5C:
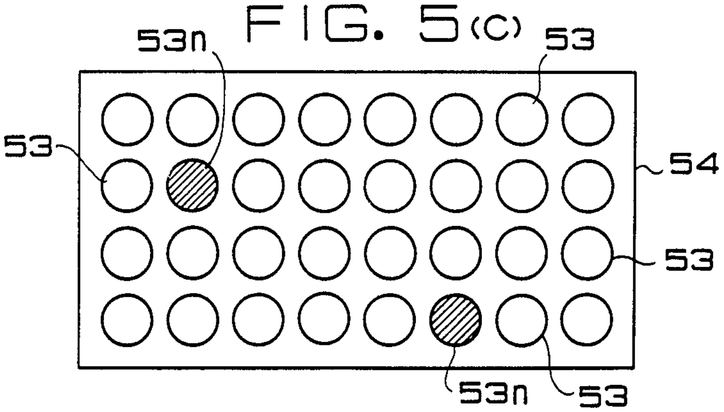

In the above embodiment, the following operation is performed as shown in the flow chart of FIG. 4. To begin with, an explanation will be given of the term "blank display test" (hereinafter abbreviated to BDT). According to this test, the light emitting elements 53 of an arbitrary display unit 54 are turned off in a state where a video is presented on the display board 52 as illustrated in FIG. 5 (*b*), and the position of the faulty light emitting element 53*n* is detected by adjusting the display unit to be positionally coincident with the element 53*n*. First, a video display (VD) key is depressed [ST-1]. Then the CPU board 34 receives VD data and sends a video display command to the motion image processor 38 [ST-2]. In response to this command, the video data is written and read so that the video is presented on the display board [ST-3].

Figure 6:
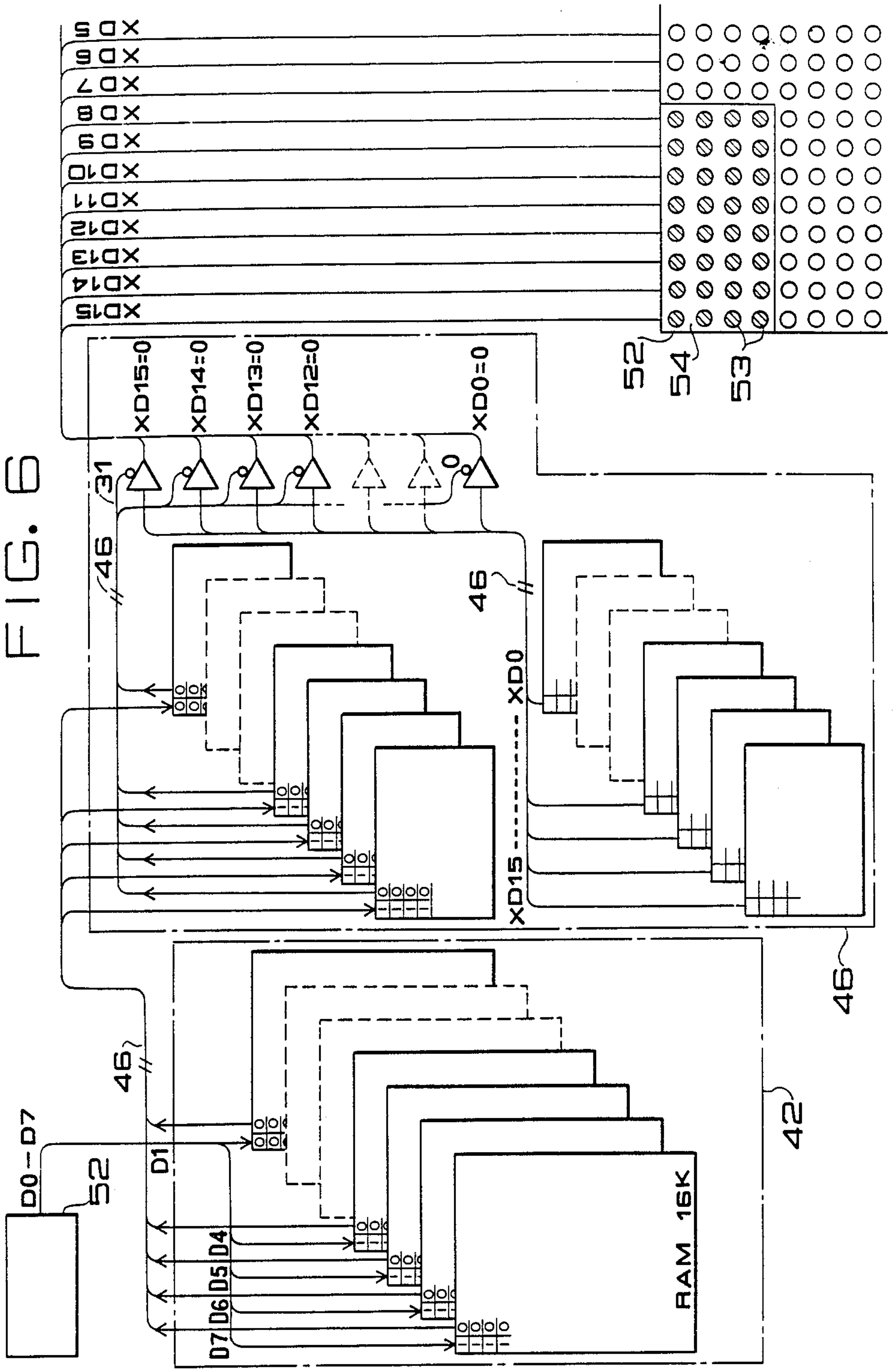
FIG. 6 schematically illustrates how data are transferred between the component devices in the test of FIG. 4.

Subsequently, a blank display test (BDT) key is depressed [ST-4]. Then the CPU board 34 receives blank display data and reads out from the memory board 37 the data for presenting a display test pattern of FIG. 5 (*a*) on the CRT display 31, thereby displaying the image of a blank pattern on the CRT screen as shown in FIG. 5 (*a*) [ST-5]. In this stage, if a faulty light emitting element 53*n* is existent in the display unit 54, half the heaters of one unit 54 are not energized as shown in FIG. 5 (*b*) due to the fault of one light emitting element 53*n*, so that the elements 53 . . . constituting half the unit are turned off. Therefore, noting the dark portion of the large display screen 52, a display unit 54 in the vicinity thereof is designated with the X and Y positions [ST-6]. Such designation is transmitted via the CPU 34 of the character processor 33 to the CPU 39 of the motion image processor 38 and, in response to the blank display test (BDT) command, the CPU 39 writes and reads the address of the light emitting elements 53 of the above display unit 54 in and from the frame memory 46, thereby turning off the entire light emitting elements 53 of the designated display unit 54 simultaneously [ST-7]. FIG. 6 shows how the data are transferred between the character control board 42 and the frame memory 46 in this step.

The data of the CPU board 39 representing one address is composed of 8 bits, while the data of the character control board 42 is composed of 16 bits. Therefore the latter data ("1" or "0") is divided, when written in the memory, into two at the least significant bit of the address signal from the CPU board 39. Upon completion of such writing, the CPU board 39 transfers the data from the character control board 42 to the video mask memory included in the frame memory 46 [ST-7]. In the frame memory, the address of the video mask memory and the address of the video memory correspond to each other at 1:1, so that the data written in the video mask memory decides whether the data of the video memory corresponding to the address is valid or invalid. For example, the video data is rendered invalid when the data is "1". In other words, the light emitting element 53 is turned off.

Upon termination of transferring the data to the video mask memory, the mask data is read out and merely the video data corresponding to the address represented by the mask data "0" is fed to the display board, thereby turning off only the light emitting elements 53 of the display unit designated with, e.g. X=1, Y=1.

In case the display unit turned off is not coincident with the faulty light emitting element 53*n*, an operation is so performed as to attain positional coincidence therebetween by depressing the keys ↑, ↓, ← and → on the keyboard [ST-8]. When the CPU board 39 receives each key code, the X or Y value stored in the memory board 41 is renewed. For example, 1 is added to the X value in response to a key code →. And the result is transmitted to both the CRT display 31 and the motion image processor 38. Then the renewed X and Y values are presented on the CRT display 31 [ST-9], while writing and reading the data into and from the memory are executed in the motion image processor 38 in accordance with the X and Y values, so that the light emitting elements 53 of the display unit represented by the X and Y values are turned off [ST-10].

The blank pattern display test is conducted in the procedure mentioned above, and thus positional detection can be performed in a state where the display unit including the faulty light emitting element 53*n* is kept attached to the large display screen.

Now another embodiment of the invention will be described with reference to FIG. 7 and the following. Explaining first the term "cross display test" (CDT), it is carried out by simultaneously turning on light emitting elements 53 arrayed in a column X and a row Y as shown in FIGS. 8 (*b*) and (*c*), and then adjusting the intersection of the column and the row to be positionally coincident with the faulty light emitting element **53*n***, thereby detecting the position thereof.

Figure 7A:
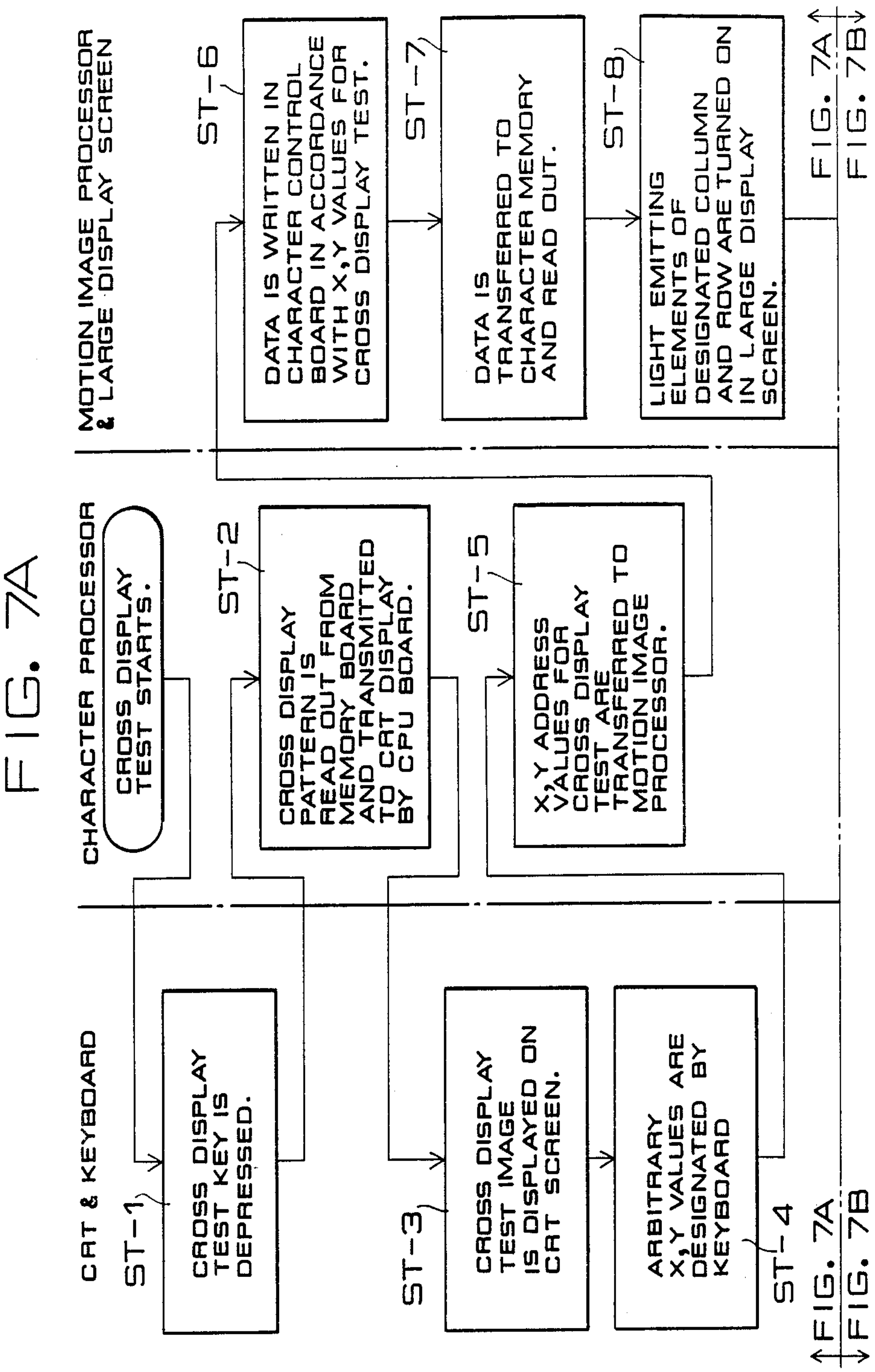
FIG. 7A and FIG. 7B form a flow chart schematically showing the steps of a cross pattern display test conducted in another exemplary position detecting apparatus embodying the invention.
Figure 7B:
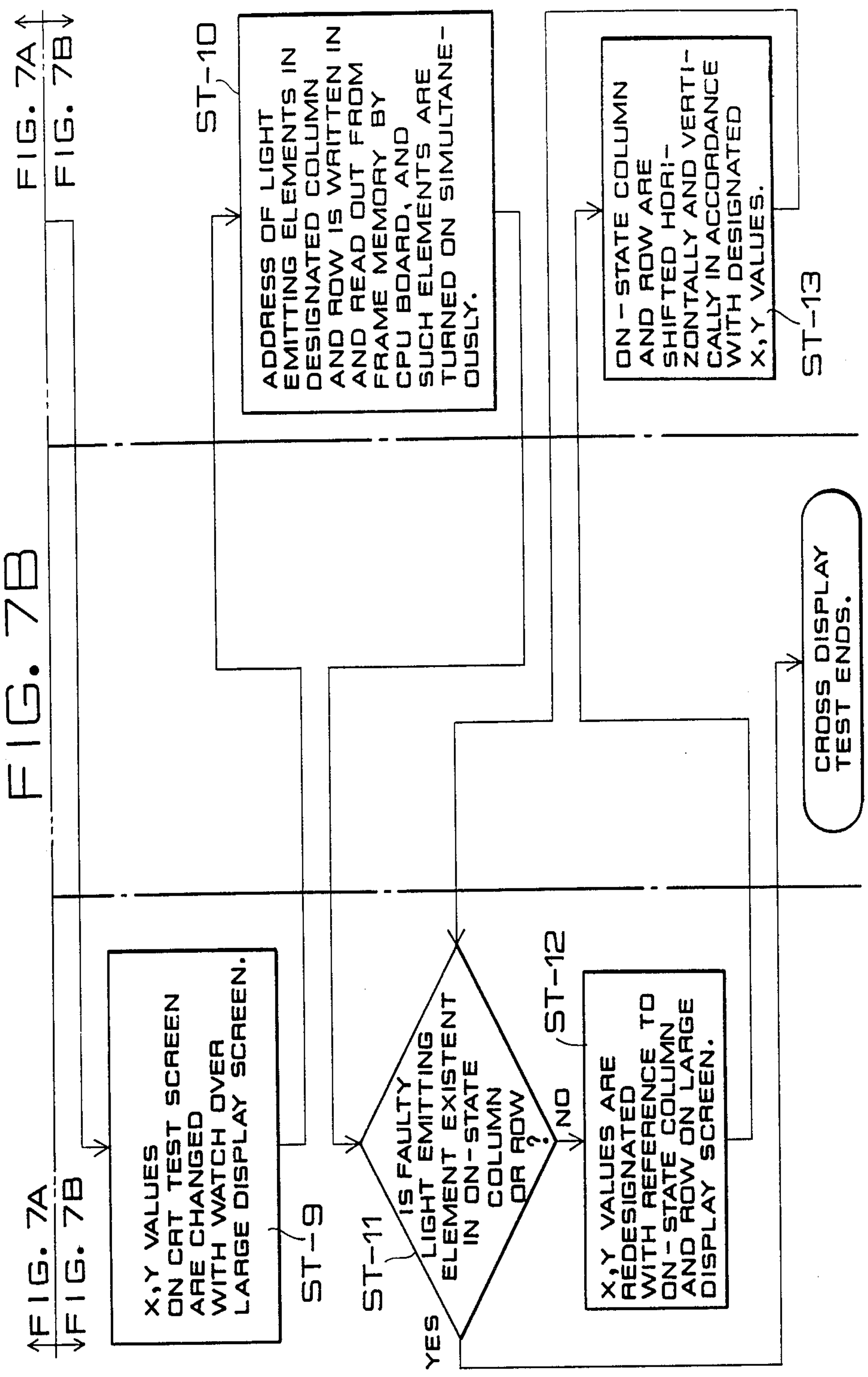
Figure 9:
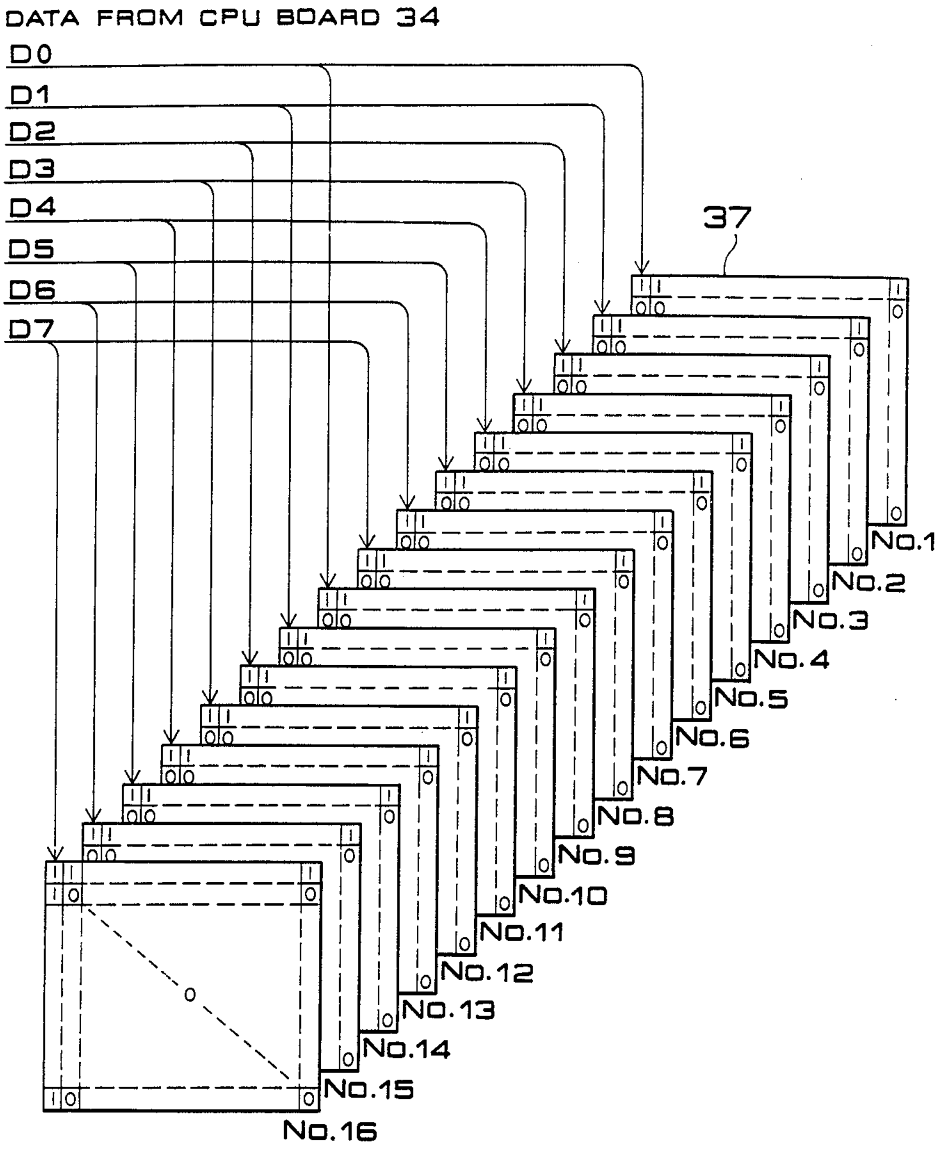
FIG. 9 schematically illustrates how data are transferred in the test of FIGS. 7A and 7B.

The steps of such cross display test are shown in the flow chart of FIG. 7. In conducting the cross display test, first the screen of the display board 52 is cleared, and then a cross display test (CDT) key is depressed [ST-1]. In response to the CDT data, the CPU board 34 reads out from the memory board 37 the data for presenting the display test pattern (DTP) of FIG. 8 (*a*) on the CRT display 31 [ST-2]. In FIG. 8 (*a*), Ⓐ represents the position of the light emitting element, and Ⓑ represents the position of the display unit including such light emitting element. First, the values of X=1 and Y=1 are transmitted to the CRT display 31 [ST-3], where X represents a horizontal address on the display board 52 and Y represents a vertical address thereon. Since the CPU board 34 is transmitting the data of CDT mode to the motion image processor 38, when the X and Y values are designated by the keyboard 32 [ST-4], the CPU board 39 writes the data in the memory board 41 of the character control board 42 in accordance with such X and Y values [ST-5]. In FIG. 9, there is shown a procedure of writing the data in the case of X=1 and Y=1. FIG. 9 is a model diagram illustrating how the test data from the CPU board 34 of the character processor 3 is written in the character control board 42 of the motion image processor 38. First, the CPU board 34 sends the test data read out from the memory board 37 via the serial interface 35 to the CRT display 31 and, after confirming it, calls via 8-bit address buses $D_0$, $D_1$ . . . $D_7$ the test data written in the memory board 37, i.e. the data corresponding to the character control board 42. And posterior to conversion of the test data into serial data by the motion image processor 36, the CPU board 34 transmits the serial data as cross display test data via the serial interface 40 to the character control board 42 [ST-6]. As mentioned previously, the data of the CPU board 39 representing one address is composed of 8 bits, while the data of the character control board 42 is composed of 16 bits. Therefore the latter data ("1" or "0") is divided, when written in the memory, into two at the least significant bit of the address of the CPU board 39. Upon completion of such writing, the CPU board 39 transfers the data from the character control board 42 to the character memory included in the frame memory 46 and, after termination of the transfer, reads out the data [ST-7] and transfers it to the large display screen 52 for visual presentation thereon [ST-8]. This step is shown in FIG. 8 (*b*), where the light emitting elements of one column and one row are so turned on as to mutually intersect at the respective X and Y values.

Subsequently, the light emitting elements of one column and one row thus turned on are shifted vertically and horizontally by manipulating the keyboard 32 while watching the large display screen and the CRT test screen (FIG. 8 (*a*)) [ST-9]. The values designated by the keyboard 32 are processed by both the CPU board 34 of the character processor 33 and the CPU board 39 of the motion image processor 38, and the addresses of the individual light emitting elements 53 in the designated column and row are written in and read out from the frame memory 46, whereby the entirety of such elements are turned on simultaneously [ST-10]. Whether the faulty light emitting element **53*n* is positioned at the column-and-row intersection is read out from a combination of the large display screen 52 and the X and Y values on the CRT screen 31 [ST-11]. And when the position of such faulty element is coincident with the intersection, the X and Y values at the time are checked to terminate the positional detection. In case no coincidence is attained, the X and Y values are redesignated [ST-12] and the on-state light emitting elements are shifted vertically and horizontally [ST-13], whereby the position of every faulty light emitting element 53*n*** can be detected.

For example, if there exist two faulty light emitting elements **53*n* as shown in FIG. 8** (*c*), one faulty element $53n_1$ at the intersection of column $X=\alpha$ and row $Y=\beta$ is first detected, and then another faulty element $53n_2$ at the intersection of column $X=\alpha+3$ and row $Y=\beta$ is detected with rightward shift of three columns.

Thus, as described hereinabove, the following effects are achievable in the apparatus of this invention designed for detecting the positions of faulty light emitting elements in a large screen display system.

Firstly, the position of any faulty light emitting element can be detected by contrasting the CRT with the large screen and turning on or off an arbitrary group of light emitting elements without removal of any display units thereof that constitute the large screen, hence simplifying the work for positional detection and realizing complete and exact maintenance of the large screen display system.

Secondly, any fault position can be accurately located by the use of accessory devices to automatically store or print the coordinate values of the on-state or off-state light emitting elements displayed on the CRT screen. Consequently, even after turning off the entirety of the large display screen, it is still possible to repair or replace any faulty light emitting element with a normal one without failure.

Thirdly, remarkable effect can be accomplished particularly in the cross pattern display test for positional detection, wherein light emitting elements of one column and one row are turned on out of those arrayed in multiple columns and rows, and the faulty light emitting element is positionally so adjusted as to coincide with the intersection of the column and the row, thereby attaining desired positional detection with precision to eventually enhance the reliability in the operation.

And fourthly, in the large screen display system equipped with a display means and a control means, mere additional connection of a CRT and a keyboard to the operating part of the control means eliminates the necessity of providing a separate large detecting apparatus, hence reducing the production cost and minimizing the space required for installation.

What is claimed is:

1. An apparatus for detecting the position of a faulty light emitting element in a large screen display system equipped with at least a character processor and a motion image processor as control means, said apparatus comprising:

an input means connected to said character processor and receiving a predetermined position code of turn-on and turn-off realtive to an arbitrary group of light emitting elements arrayed vertically and horizontally in a multiplicity of columns and rows on the large screen;

a display means connected to both said character processor and said input means and serving to display said position code of the group of light emitting elements inputted from said input means;

and a drive control means incorporated in said motion image processor and individually controlling the light emitting elements to be turned on or off in accordance with said position code of the element group inputted from said input means and displayed on said display means;

said drive control means being so formed as to turn off said element group within a prescribed area extending vertically and horizontally on said large display screen, while turning on the entire light emitting elements elements on said large display screen with the exception of said element group, and placing the faulty light emitting element in a blank pattern to detect the fault position;

said input means and said display means functioning respectively to designate the position code of the light emitting element in said blank pattern and to display the blank portion of said element group.

2. The apparatus as defined in claim 1 wherein a certain image is displayed on said large display screen by a video means in accordance with the input from said input means, and the position of a faulty light emitting element is detected by turning off the element group in which the faulty light emitting element is existent.

3. The apparatus as defined in claim 1, wherein the position code fed from said input means for turning on or off said element group is processed by said character processor and said motion image processor, and the designated address is written in and read out from a frame memory included in said motion image processor, thereby turning on or off said element group within a prescribed area.

4. The apparatus as defined in claim 3, wherein said frame memory is composed of a random access memory.

5. The apparatus as defined in claim 1, wherein each of said character processor and said motion image processor is equipped with a central processing unit, and the position code fed as character data from the input means by said central processing unit of said character processor is converted into position data of the light emitting elements on said large screen, and a specific portion of said large screen is turned on or off in accordance with such position data.

6. The apparatus as defined in claim 1, wherein said input means is composed of a keyboard.

7. The apparatus as defined in claim 1, wherein said display means is composed of a cathode-ray tube.

8. An apparatus for detecting the position of a faulty light emitting element in a large screen display system equipped with at least a character processor and a motion image processor as control means, said apparatus comprising:

an input means connected to said character processor and receiving a predetermined position code of turn-on and turn-off relative to an arbitrary group of light emitting elements arrayed vertically and horizontally in a multiplicity of columns and rows on the large screen;

a display means connected to both said character processor and said input means and serving to display said position code of the group of light emitting elements inputted from said input means;

and a drive control means incorporated in said motion image processor and individually controlling the light emitting elements to be turned on or off in accordance with said position code of the element group inputted from said input means and displayed on said display means;

said drive control means being so formed as to turn on, out of all the light emitting elements arrayed on said large display screen, merely those of one column and one row, then sequentially shifting said on-state column and row by changing the command content fed from said input means, and positioning the fault light emitting element at the intersection of said on-state column and row, thereby enabling positional detection of said faulty light emitting element from said display means.

9. The apparatus as defined in claim 8, wherein the position code fed from said input means for turning on or off said element group is processed by said character processor and said motion image processor, and the designated address is written in and read out from the frame memory included in said motion image processor, thereby turning on or off said element group within a prescribed area.

10. The apparatus as defined in claim 9, wherein said frame memory is is composed of a random access memory.

11. The apparatus as defined in claim 8, wherein each of said character processor and said motion image processor is equipped with a central processing unit, and the position code fed as character data from the input means by said central processing unit of said character processor is converted into position data of the light emitting elements on said large screen, and a specific portion of said large screen is turned on or off in accordance with such position data.

12. The apparatus as defined in claim 8, wherein said input means is composed of a keyboard.

13. The apparatus as defined in claim 8, wherein said display means is composed of a cathode-ray tube.

* * * * *

UNITED STATES PATENT AND TRADEMARK OFFICE

CERTIFICATE OF CORRECTION

PATENT NO. : 4,764,728

DATED : August 16, 1988

INVENTOR(S) : Yasuhiro Sato et al.

It is certified that error appears in the above-identified patent and that said Letters Patent is hereby corrected as shown below:

On the front page, second to last line of the Abstract, "conincidence" should be --coincidence--.

Column 8, line 58, "realtive" should be --relative--.

Column 9, line 8, delete "elements" (second occurrence);

line 16, after "1" insert --,--.

Column 10, line 23, "fault" should be --faulty--;

line 36, delete "is" (second occurrence).

Signed and Sealed this

Thirty-first Day of October, 1989

*Attest:*

DONALD J. QUIGG

*Attesting Officer* *Commissioner of Patents and Trademarks*